US008849617B2

(12) United States Patent
Ilias

(10) Patent No.: US 8,849,617 B2
(45) Date of Patent: Sep. 30, 2014

(54) GEOMETRIC SINGULARITY DETECTION

(75) Inventor: Horea T. Ilias, Glastonbury, CT (US)

(73) Assignee: University of Connecticut, Farmington, CT (US)

( * ) Notice: Subject to any disclaimer, the term of this patent is extended or adjusted under 35 U.S.C. 154(b) by 816 days.

(21) Appl. No.: 12/181,252

(22) Filed: Jul. 28, 2008

(65) Prior Publication Data
US 2009/0055136 A1 Feb. 26, 2009

Related U.S. Application Data

(60) Provisional application No. 60/952,221, filed on Jul. 26, 2007.

(51) Int. Cl.
*G06F 17/50* (2006.01)
*G06T 17/30* (2006.01)
*G06K 9/46* (2006.01)

(52) U.S. Cl.
CPC ............ *G06F 17/50* (2013.01); *G06T 17/30* (2013.01); *G06K 9/4604* (2013.01)
USPC ............ 703/1; 700/97; 700/98; 345/419; 345/420

(58) Field of Classification Search
CPC ....... G06F 17/50; G06T 17/30; G06K 9/4604
USPC ............ 703/1; 700/97–98; 345/420
See application file for complete search history.

(56) References Cited

U.S. PATENT DOCUMENTS 6,044,306 A * 3/2000 Shapiro et al. ............... 700/90
7,453,456 B2 * 11/2008 Petrov et al. ............... 345/419

OTHER PUBLICATIONS

Hui et al., "Display techniques and boundary evaluation of a Sweep-CSG modeller", 1991, The Visual Computer, pp. 18-34.*
Savkar et al., "Graduate Research Competition 2007", Apr. 5, 2007, Department of Mechanical Engineering University of Connecticut, p. 5.*

* cited by examiner

*Primary Examiner* — Eunhee Kim
(74) *Attorney, Agent, or Firm* — Ohlandt, Greeley, Ruggiero & Perle, L.L.P.

(57) ABSTRACT

A system and method for geometric singularity is presented. In one aspect, the system and method are employed for detecting and quantifying envelope singularities of one or more solid shapes in relative movement. In an implementation, a solid shape having a motion is defined. A set of points in a space in which the motion of the solid shape occurs are sampled. For each point in the set of points, the following values are determined: an inverted motion of the motion; one or more inverted trajectories that correspond to points of the space associated with the inverted motion; one or more intersections between the inverted trajectories and a boundary defined by the motion of the solid shape; and one or more tangencies between the inverted trajectories and the boundary. Each point in the set of points is then classified as a function of values of the intersections and tangencies, each classification being one of a set of classifications including an interior fold point, a fold boundary point, a regular point, a sweep boundary point, or a point exterior to the set swept by the solid shape during the motion.

13 Claims, 13 Drawing Sheets

(a) The disk generates a 3D solid in the higher dimensional space (x,y,t).

(b) The 3D solid of Figure (c) shown as a shaded solid model.

(c) Cusp singularities in surface Σ

Figure2: Envelope $\mathfrak{D}$ is the apparent contour of $\Sigma$ in the direction of t.

(a) The disk generates a 3D solid in the higher dimensional space (x,y,t).

(b) The 3D solid of Figure (c) shown as a shaded solid model.

(c) Cusp singularities in surface Σ

GEOMETRIC SINGULARITY DETECTION

CROSS-REFERENCE TO RELATED APPLICATIONS

This application claims priority to provisional U.S. application Ser. No. 60/952,221, entitled "Geometric Singularity Detection", and filed Jul. 26, 2007, the content of which is hereby incorporated by reference in its entirety.

BACKGROUND OF THE INVENTION

The mathematical envelopes to families of both rigid and non-rigid shapes (or, equivalently, of moving shapes) are fundamental to a variety of problems from very diverse application domains, such as engineering design, computer aided manufacturing and path planning, problems characterized by evolving interfaces, geometric modeling or computer graphics. Singularities in these envelopes are known to induce malfunction or unintended system behavior, but the corresponding theoretical and computational difficulties are both massive and well documented. Despite their long history, the detection of these singularities remains one of the significant open problems faced in engineering today, which effectively precludes any attempts to develop systematic and generic approaches for eliminating these singularities.

Sweeping an object through space is one of the fundamental operations in geometric modeling. Furthermore, many practical problems from very diverse fields ranging from engineering design and manufacturing to robotics, computer graphics and computer assisted surgery can be formulated in terms of sweeps. The boundary of a set swept by an object in motion is expressed mathematically as the envelope to the family of shapes defined by the moving object. These envelopes, which are defined as solutions to specific differential equations, are known to exhibit geometric singularities. In practical terms, these envelope singularities induce malfunctions or unintended system behavior in the corresponding applications. However, the corresponding theoretical and computational difficulties induced by these singularities are not only massive, but also well documented.

Consider a simple cam-follower mechanism used to transform a rotation with constant angular velocity of a shaft into a relatively complex output motion, such as that illustrated in FIG. 1. Such a design problem is typically formulated in terms of the set swept by the moving follower relative to the cam. The boundary of such a cam is a subset of the envelopes of the moving follower (in this case a 2D disk). Though, for a given follower as well as cam and follower motions, the envelopes of the moving follower will not always be in contact with the follower. In other words, a cam that would move the follower according to the prescribed motion may not exist. This case is illustrated in FIG. 1, where the follower is moving relative to the cam such that its center moves along the specified trajectory. In this example, loss of contact between the follower and the resulting external cam would occur twice during a complete cycle of the relative motion.

The envelopes corresponding to the loss of contact have singular points, which is discussed in more detail below. This phenomenon is known as undercutting in the design of higher kinematic pairs, but it obviously occurs in all the application domains mentioned above. Once singularities, and therefore loss of contact, are detected, one can change either the motion, the geometry or a combination of these to correct the loss of contact. However, it is intuitively clear that the development of an algorithmic approach to eliminate this condition would require knowledge not only of whether singularities (and therefore undercutting) exists, but also of how severe this condition is. Furthermore, the knowledge of what part of the boundary of the moving object is responsible for generating these singularities during the given motion could lead to performing systematic geometric changes that eliminate this condition.

Unfortunately, the current approaches to detect these singularities are fairly specialized and scattered across all these application domains. The more advanced techniques require the ability to compute or approximate the envelopes, and most are applicable only to restricted classes of geometries and motions to an extent that some practical cases have no known solution. The fact that these approaches provide (at most) a binary answer, even for the classes of problems that they can handle, implies that the elimination of these singularities (e.g., via changes in geometry, motion or both) is forced to rely only on the accumulated engineering experience and heuristics. On the other hand, the ability to systematically detect, quantify, and eliminate these singularities, and hence the corresponding malfunctions, would be extremely beneficial to all these application domains. The reasons for the status quo discussed above are well documented: mathematical singularities are known to create extreme difficulties, not only in the analytical realm, but also in the computational domain.

Broadly, there are two categories of approaches for detecting geometric singularities in the envelopes of moving surfaces. The first category includes those (traditional) approaches that provide a closed form solution to the existence of these singularities. Unfortunately, such conditions can be derived only in those cases that place severe restrictions on the geometry and motion, which prevents them from being applicable to most "interesting" practical situations.

The second category of approaches rely on the theory on envelopes to detect these singularities, and, consequently, the associated system malfunctions. Though, these approaches are limited by the ability to compute or approximate the envelopes, which remains a difficult problem for general shapes and motions. Hence, these approaches are also forced to restrict the class of problems so that the envelopes can be approximated.

In the field of mechanical design, the loss of contact (or "undercutting") in a higher kinematic pair has been known for over a century and represents one of the significant roadblocks in the design and manufacturing of higher pairs. Many of the earlier techniques for detecting loss of contact in the design of higher pairs fall in the first category mentioned above, and exploit the relatively simple geometry of the pairs (cylindrical or planar follower). Thus, these techniques can be applied only to the cases satisfying very specific and limiting geometric assumptions. The recent methods to design cam mechanisms have used envelope computations for cylindrical or flat faced followers. Almost independently from these efforts, differential geometry has been used in the gear design literature to develop mathematical conditions of non-existence for envelope singularities. The derivation of these conditions relies on a theorem relating the existence of the singular points to the zero valued sliding velocity at the contact point. All these techniques address specific classes of problems, and require difficult numerical computations, which, in turn, limits their applicability. Moreover, undercutting conditions for some classes of gearing mechanisms, such as wormgears, do not seem to be presently known.

The need to detect the singularities in the envelopes occurs in other applications as well. For example, envelope singularities are used in computer aided manufacturing and computer aided process planning to describe workpiece undercutting resulting in part defects. In this context, similar techniques based on the theory of envelopes have been coupled with assumptions on simple tool geometries to develop specific undercutting conditions. Singularities and their computational properties also play a significant role in sweep boundary evaluation; in Minkowski operations and offsets computations; in problems involving moving fronts, and in computing the geometry of shadows in computer graphics applications.

One of the recent techniques for computing offset curves and surfaces uses rational distance maps to eliminate the portions of the envelopes that are part of the set swept by a moving object. This approach is aimed at computing the boundary of the sweep, and does not quantify the regions where the loss of contact occurs. Recent attempts to detect the envelope singularities rely on envelope computations one way or another, and face the limitations discussed above. Importantly, none of these approaches quantifies the severity of these singularities, or of the associated malfunctions (such as the undercutting or overcutting in higher kinematic pairs), and give practically no support to the task of eliminating these singularities.

SUMMARY OF THE INVENTION

Various aspects of the invention provides one or more of the following capabilities. A method for the detection and quantification of envelope singularities may be provided which does not require any envelope computations. The method is parallel in nature so parallel algorithms can potentially achieve increases in computational speed. A point membership classification test may be provided for set swept by an object moving according to a one parameter affine motion, including points interior to the sweep (regular, fold, and fold boundary points) on the boundary of the sweep or exterior to the sweep, which provides complete geometric information about the set swept by the moving object, including the fold regions. An approach can be provided for a generic technique to detect and quantify the loss of contact between a moving solid generator, and any object that may come in contact with the generator. An approach can be provided for performing continuous collision and interference detection between sets of points moving relative to each other according to an affine motion. An approach can be provided for determining geometric singularities of moving boundaries.

In some implementations, a system and method for geometric singularity is disclosed. In one aspect, the system and method are employed for detecting and quantifying envelope singularities of one or more solid shapes in relative movement. In specific exemplary implementations, a solid shape having a motion is defined. A set of points in a space in which the motion of the solid shape occurs are sampled. For each point in the set of points, the following values are determined: an inverted motion of the motion; one or more inverted trajectories that correspond to points of the space associated with the inverted motion; one or more intersections between the inverted trajectories and a boundary defined by the motion of the solid shape; and one or more tangencies between the inverted trajectories and the boundary. Each point in the set of points is then classified as a function of values of the intersections and tangencies, each classification being one of a set of classifications including an interior fold point, a fold boundary point, a regular point, a sweep boundary point, or a point exterior to the set swept by the solid shape during the motion.

The method may further include marking corresponding points of the space defined by the motion of the solid shape corresponding to each classified interior fold point and fold boundary point. Defining the solid shape of the method may include defining a plurality of ranges of geometries and motions for the solid shape. The solid shape may be defined by a plurality of sets of points, each set of points including curves and surfaces. The plurality of sets of points may define a moving front and other deforming boundaries.

In another aspect, a method for computing offset curves and surfaces for a shape having a motion is disclosed. The method includes determining, for each point in a set of points in a space in which motion of the shape occurs, values of: an inverted motion of the motion, one or more inverted trajectories that correspond to points of the space associated with the inverted motion, one or more intersections between the inverted trajectories and the shape, and one or more tangencies between the inverted trajectory and the shape. The method also includes classifying each point in the set of points as a function of values of the intersections and tangencies, each classification being one of a set of classifications including an interior fold point, a fold boundary point, a regular point, a sweep boundary point, or a point exterior to the set swept by the shape during the motion and marking corresponding points of the space corresponding to each classified point.

In another aspect, a computer program product including a set of instructions on a tangible medium is disclosed. The instructions causing a processor to: define a solid shape having a motion, and sample a set of points in a space in which the motion of the solid shape occurs. The product including the set of instructions also determine, for each point in the set of points, values of: an inverted motion of the motion, an inverted trajectory that corresponds to the inverted motion, intersections between the inverted trajectory and a boundary defined by the motion of the solid shape, and tangencies between the inverted trajectory and the boundary, and classify each point in the set of points as a function of values of the intersections and tangencies, each classification being one of a set of classifications including an interior fold point, a fold boundary point, a regular point, a sweep boundary point, or a point exterior to the set swept by the solid shape during the motion.

In another aspect, a system for detecting and quantifying envelope singularities is disclosed. The system includes means for defining a solid shape having a motion, a sampler to sample a set of points in a space in which the motion of the solid shape occurs, means for determining, for each point in the set of points, values of: an inverted motion of the motion, inverted trajectories that correspond to points of the space moving according to the inverted motion, intersections between the inverted trajectories and a boundary defined by the motion of the solid shape, and tangencies between the inverted trajectories and the boundary. The system also includes means for classifying each point in the set of points as a function of values of the intersections and tangencies, each classification being one of a set of classifications including an interior fold point, a fold boundary point, a regular point, a sweep boundary point, or a point exterior to the set swept by the solid shape during the motion.

In another aspect, a method for detecting and quantifying envelope singularities is disclosed. The method includes defining a first solid shape having a motion, defining a second shape, possibly having a second motion, determining relative motion of the first solid shape relative to the second shape, sampling a set of points in a space in which the second shape exists, and determining, for each point in the set of points, values of: an inverted motion of the relative motion between the first and second shapes, inverted trajectories that correspond to points of the space associated with the inverted motion, intersections between the inverted trajectories and a boundary defined by the motion of the first solid shape, and tangencies between the inverted trajectories and the boundary. The method also includes classifying each point in the set of points as a function of values of the intersections and tangencies, each classification being one of a set of classifications including an interior fold point, a fold boundary point, a regular point, a sweep boundary point, or a point exterior to the set swept by the solid shape during the motion.

The method may further include determining a contact between the first solid shape and the second shape based at least in part on the classifications of each point in the set of points.

The method may further include detecting a loss of contact between the first solid shape and the second shape based at least in part on the classifications of each point in the set of points.

The method may further include quantifying the loss of contact between the first solid shape and the second shape.

The method may further include determining a contact path between the first solid shape and the second shape based in part on the contact, and quantifying the contact path for at least one of a group of selected processes on the first solid shape against the second shape.

Defining the first solid shape and defining the second shape may include defining a plurality of ranges of geometries and motions for the first solid shape and second shape.

The approach described herein could be used not only to compute these regions of loss of contact, but also to perform sweep boundary evaluation and trimming for arbitrary moving planar objects.

These and other capabilities will be more fully understood after a review of the following figures, detailed description, and claims.

DETAILED DESCRIPTION OF PREFERRED EMBODIMENTS

This document describes a system and method for detecting and quantifying envelope singularities. Such system and method can be used to compute collision and interference among solid moving objects, including computing the sweeps of points of moving objects. Exemplary embodiments may also provide a system and method for performing contact analysis between a moving solid and the boundary of its swept volume.

Assume that a motion M is a one-parameter family of transformations M(t), and that parameter t belongs to the normalized unit interval. At every instant t=a, a set X moves to a new location in space determined by transformation q=M(a). The superscript notation is used to define the transformed (set of) points as $X^q = X^{M(a)} = M(a)X$.

The transformation $q \in M(t)$ for some instantaneous value t=a determines the position and orientation of X relative to a fixed coordinate system. In an absolute coordinate system, every point x of X will describe a trajectory $T_x = \{x^q | q \in M\}$ in the d-dimensional Euclidean space $E^d$ in which the motion takes place. However, when observed from a moving coordinate system rigidly attached to the moving set X, the same point x will appear to describe a different trajectory denoted by $\hat{T}_x$ $$\hat{T}_x = \{x^p | p \in \hat{M}\} \tag{1}$$

where $\hat{M}$ is the inverted motion, i.e., $\hat{M}(t)$ is the inverse of M(t) for every value of t.

It can be shown that the inverted trajectory $\hat{T}_x$ contains all points $y \in E^d$ that will pass through a given point x when moved according to motion M (see one example in FIG. 5):

$$\hat{T}_x = \{y \in E^d | \in T_y\} \tag{2}$$

A moving object in space describes a family of shapes. By definition, the envelopes to this family contain any and all possible contact points with the moving object, typically called the generator. Thus, the boundary of any part that has to move in contact with the generator must be a subset of the envelopes, or otherwise contact will not occur for the prescribed motion.

Figure 2:
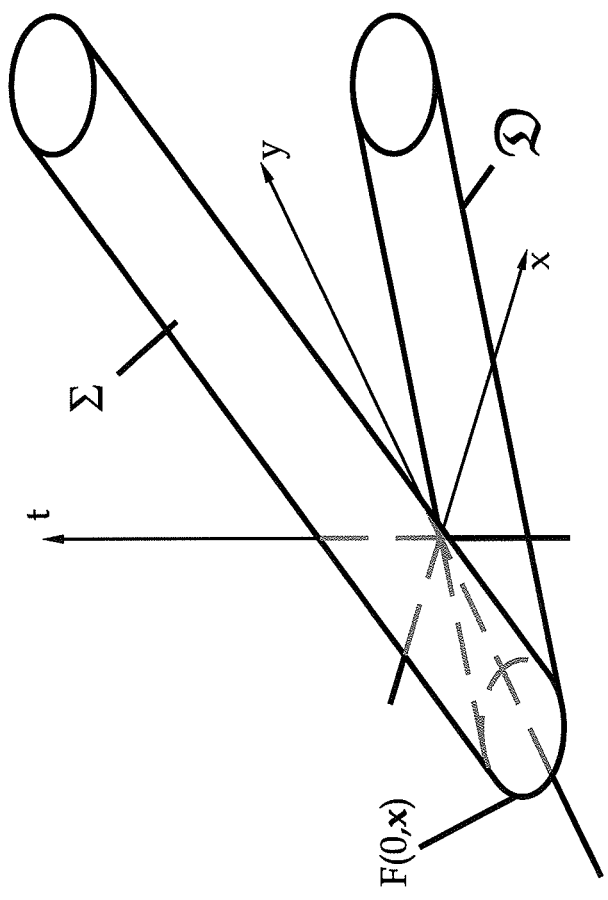
FIG. 2 is a schematic view illustrating a geometric envelope.

To illustrate the geometric significance of the envelopes, consider the family of disks in the plane shown in FIG. 2. The envelopes to this family are well defined as the curves tangent to every disk in the family. The family of disks is generated by a disk moving according to a motion, and the envelopes D are the curves tangent to the moving disk at every configuration of the motion. From a geometric perspective, determining the envelope D to a shape moving in $E^d$ amounts to constructing the higher dimensional surface $\Sigma$ in the spacetime domain $E^{d+1}$, and projecting this surface back onto $E^d$. Note that this spacetime domain contains the parameter t of motion M(t) as the additional dimension. Therefore, the original disk is moving in this space always parallel with itself, by construction. The envelope set D is in fact the apparent contour of $\Sigma$ in the direction of t (see FIG. 2).

The envelopes are defined as the solutions to a system of differential equations. Computing the points of the envelopes (also known as sweep boundary evaluation) entails essentially two steps. The first one focuses on the generation of all points that are in the envelope set, which may or may not lie on the boundary of the set swept by a moving set X. The second step involves trimming those subsets of the envelope that are not part of the boundary of the sweep. Numerous boundary evaluation algorithms have been developed in solid and geometric modeling literature that implement some versions of the two steps above. There are also several algorithms for computing the boundary of sweep for special cases, but performing boundary evaluation for general sweeps remains difficult.

Figure 3:
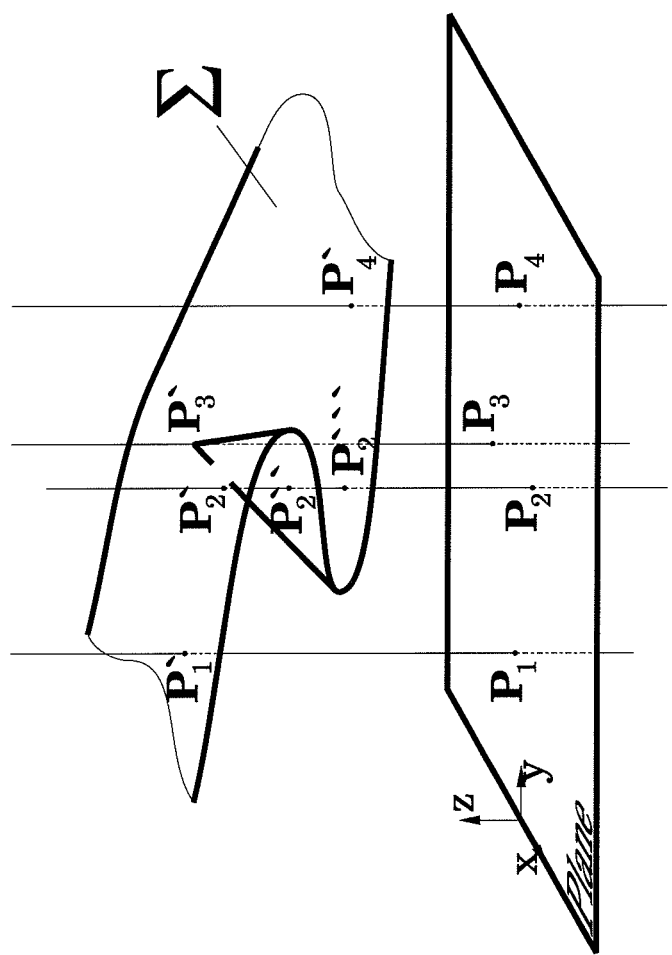
FIG. 3 is a schematic view illustrating a "catastrophe surface".

One interesting result in the theory of singularities proved that there are only two types of envelope singularities while all others are vanishing under small perturbations. The first type of singularity appears at the equatorial points of a sphere when the sphere is projected onto the plane. The other type of singularity, i.e., the cusp, is illustrated in FIG. 3 which shows the so called "catastrophe surface". In the envelope theory, the existence of cusps in $\Sigma$ are an indication of singularities in the envelope set (i.e., the projection of $\Sigma$ onto the original space), but detecting the existence of these cusps is a hard problem for general shapes and motions.

Except for some degenerate cases, the projection of a cusp point of $\Sigma$ contains some special points in its neighborhood, such that more than one point of the catastrophe surface projects (or folds) onto each such point. This is illustrated in FIG. 3 where the cusp is labeled as $P_3'$, its projection onto $E^d$ is $P_3$, and $P_2$ is a fold point. In this case there are three points of $\Sigma$ that project onto the same "fold" point $P_2$.

The foldings of $\Sigma$ in the neighborhood of these cusps are responsible for generating the areas (and the envelopes) where loss of contact, or undercutting, will occur. This is clearly seen in FIG. 4 which shows a disk translating along a prescribed curve. If one constructs the $E^{d+1}$ hyperspace, where the extra dimension is the parameter t of motion M, then disk A is sweeping a well defined set $\Sigma$ in this hyperspace as it maintains a constant orientation perpendicular to the t axis. The projection of surface $\Sigma$ onto the $E^d$ space is the set sweep (A,M) bounded by envelope D. In this example $\Sigma$ folds onto itself during the projection.

The loss of contact due to envelope singularities can intuitively be defined in terms of the set of fold points in $E^d$. For the case shown in FIG. 4, if this set of fold points is empty, there is no loss of contact for the given shape and motion. Consequently, a non-empty set may indicate that loss of contact is present, and the size of the set quantifies the severity of this loss of contact.

Figure 4:
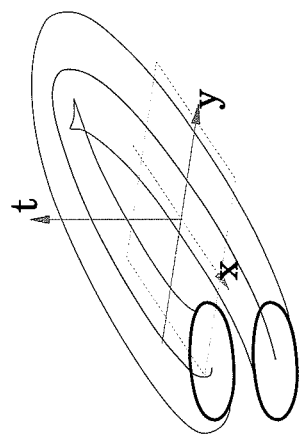
FIG. 4 is a schematic with three views illustrating singularities in the envelope generated by a disk.
Figure 4:
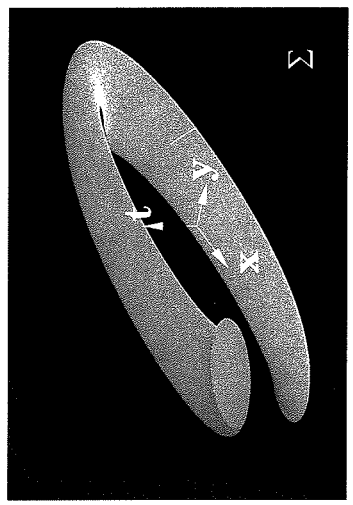
Figure 4:
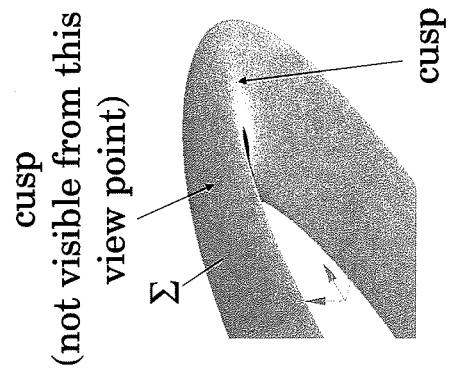

Not only that for every cusp point there are infinitely many fold points, but detecting fold points appears to be conceptually and computationally more straightforward than detecting singularities. For the case shown in FIG. 4, one can determine these fold points by intersecting vertical lines with surface $\Sigma$, and by counting the number of intersections. If a given line intersects this surface more than twice, surface $\Sigma$ will fold onto itself, thus generating the undercut area. This is illustrated in FIG. 4(c) where line $L_2$ passing through a "regular point" intersects surface $\Sigma$ only twice, while a vertical line $L_1$ passing through a fold point intersects $\Sigma$ exactly four times. As discussed below, this condition is necessary, but not sufficient to determine the fold points that generate loss of contact.

Detecting fold points by intersecting lines with surface $\Sigma$ requires the construction of a computer representation for $\Sigma$. If the original shape is 2-dimensional, then $\Sigma$ is 3-dimensional, and $\Sigma$ can be constructed, for example, within conventional CAD systems. However, it is beyond the ability of current CAD technology to handle the case when the object is 3-dimensional, and when $\Sigma$ lives in a 4-dimensional space/time domain. In this case, one could convert the original representation of the moving object to, say, an implicit representation, and construct $\Sigma$ in an implicit form. As a result, the intersection between the 4D line and the 4D $\Sigma$ would reduce to some numerical root-finding procedures. However, constructing an implicit representation of an object of arbitrary complexity, although possible in principle, is still an open problem today.

Figure 5:
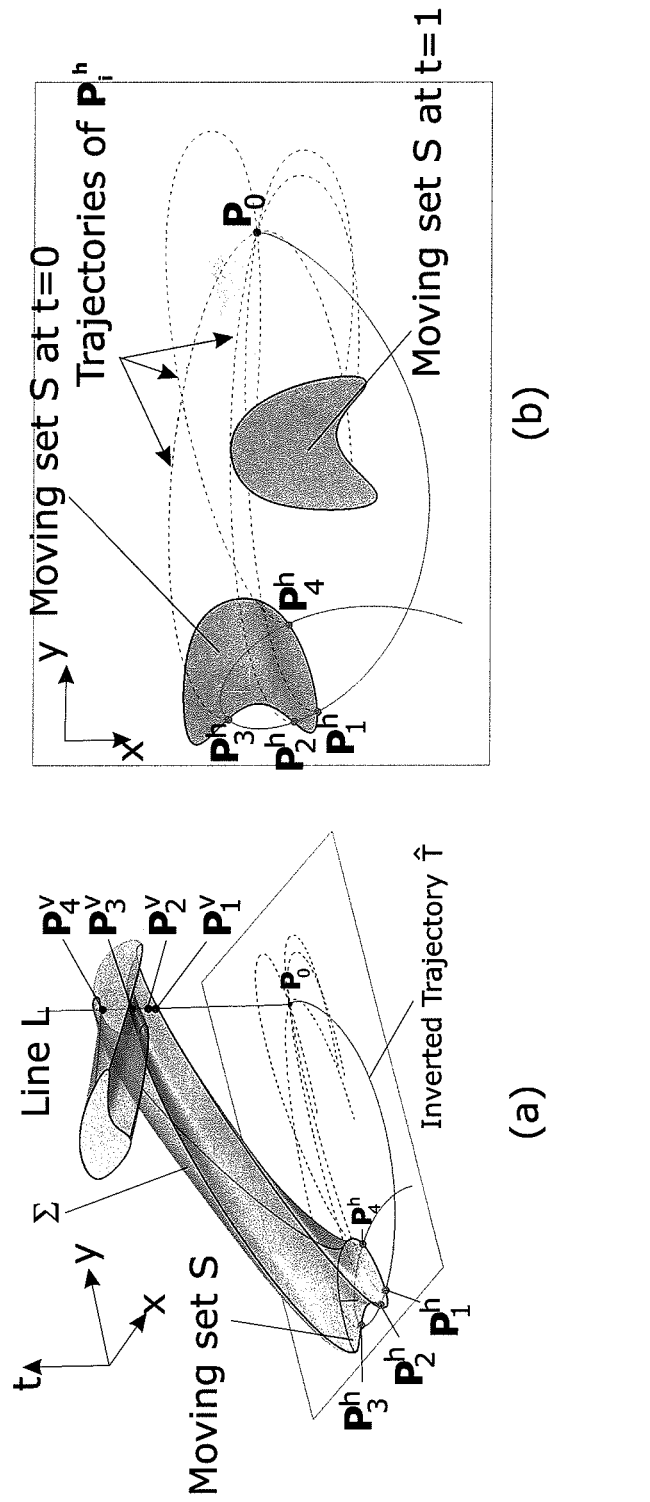
FIG. 5 is a schematic with two views illustrating singularities in the envelope generated by a two dimensional shape S.

Consider the 2-dimensional solid shape S shown in FIG. 5 that moves according to a planar rigid body motion M. In the plane, set S will sweep a set sweep(S,M)—the shaded set in FIG. 5(b), while in the higher dimensional space, the same set S will generate a solid bounded by surface $\Sigma$. The fact that $\Sigma$ bounds a solid follows from the assumption that S is solid and that the parameter of the motion increases monotonically. A vertical line parallel to the t axis passing through a point $P_0$ of the plane may or may not intersect $\Sigma$ depending on where point $P_0$ is located in the plane.

Since the set bounded by $\Sigma$ is a solid, if $P_0$ is a regular point then the line will intersect $\Sigma$ exactly twice: first when the line "enters" the set bounded by $\Sigma$, and second when the line "exits" this set. Based on the same arguments, if $P_0$ is a fold point, then a vertical line passing through $P_0$ will intersect $\Sigma$ an even number of times. If $P_0$ is on the envelope, the number of intersections between the line and $\Sigma$ will still be even, but the line will also be tangent to $\Sigma$ at one or more points.

The geometric significance of each such intersection point $P_i^v$ between the vertical line and $\Sigma$ will now be examined. Since each such point lies on $\Sigma$, which is generated by points on the boundary of $S^0$, then there exists a subset of the boundary of $S^0$ whose elements pass through $P_0$ for some values of t. Moreover, different values of $t=a_i$ are associated with each intersection point, and these values represent the coordinates of each $P_i^v$ in the direction of t. In other words, there exists only one point on the boundary of $S^0$ that will overlap with each $P_i$ for each of these parameter values $a_i \in [0,1]$.

The above discussion implies that detecting intersection points $P_i^v$ on $\Sigma$ that correspond to a point $P_0$ in the plane is equivalent to determining the boundary points of $S^0$ that will pass through $P_0$ at some parameter value t during the motion. Thus, based on the properties of the inverted trajectories outlined in the background, these boundary points of $S^0$ must lie on the inverted trajectory passing through point $P_0$. These points are labeled as $P_i^h$ in FIG. 5.

Thus, this duality recasts the problem of detecting fold points in terms of straightforward curve→d-dimensional solid intersections against the original boundary representation of shape $S^0$. The trajectories of all these boundary points $P_i^h$ of $S^0$ will pass through point $P_0$, which is illustrated in FIG. 5(b). Moreover, the set of all the fold points are the fold regions corresponding to the given shape and motion. In other words, this approach provides a Point Membership Classification (PMC) test for the fold regions, which implies that any geometric property of these fold regions can be computed. This duality can be used to develop an explicit PMC test for the set swept by the moving object to classify the points of the space that are "in", "on", or "out" of the sweep.

The existence of fold points, by themselves, do not imply that complete loss of contact will occur between the moving object and its envelope set. In other words, the existence of fold points is a necessary, but not sufficient condition for the complete loss of contact between a moving object and its envelopes.

Figure 6:
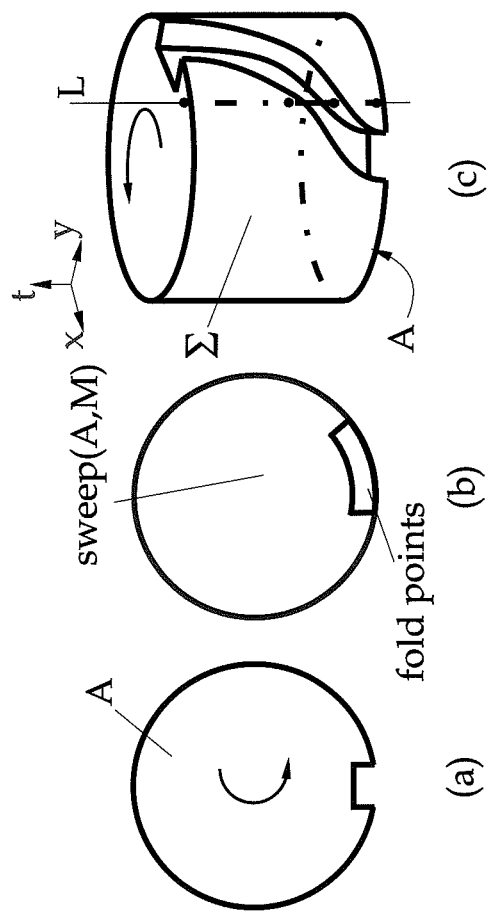
FIG. 6 is a schematic with three views illustrating a fold point in an envelope without a singularity.
Figure 8:
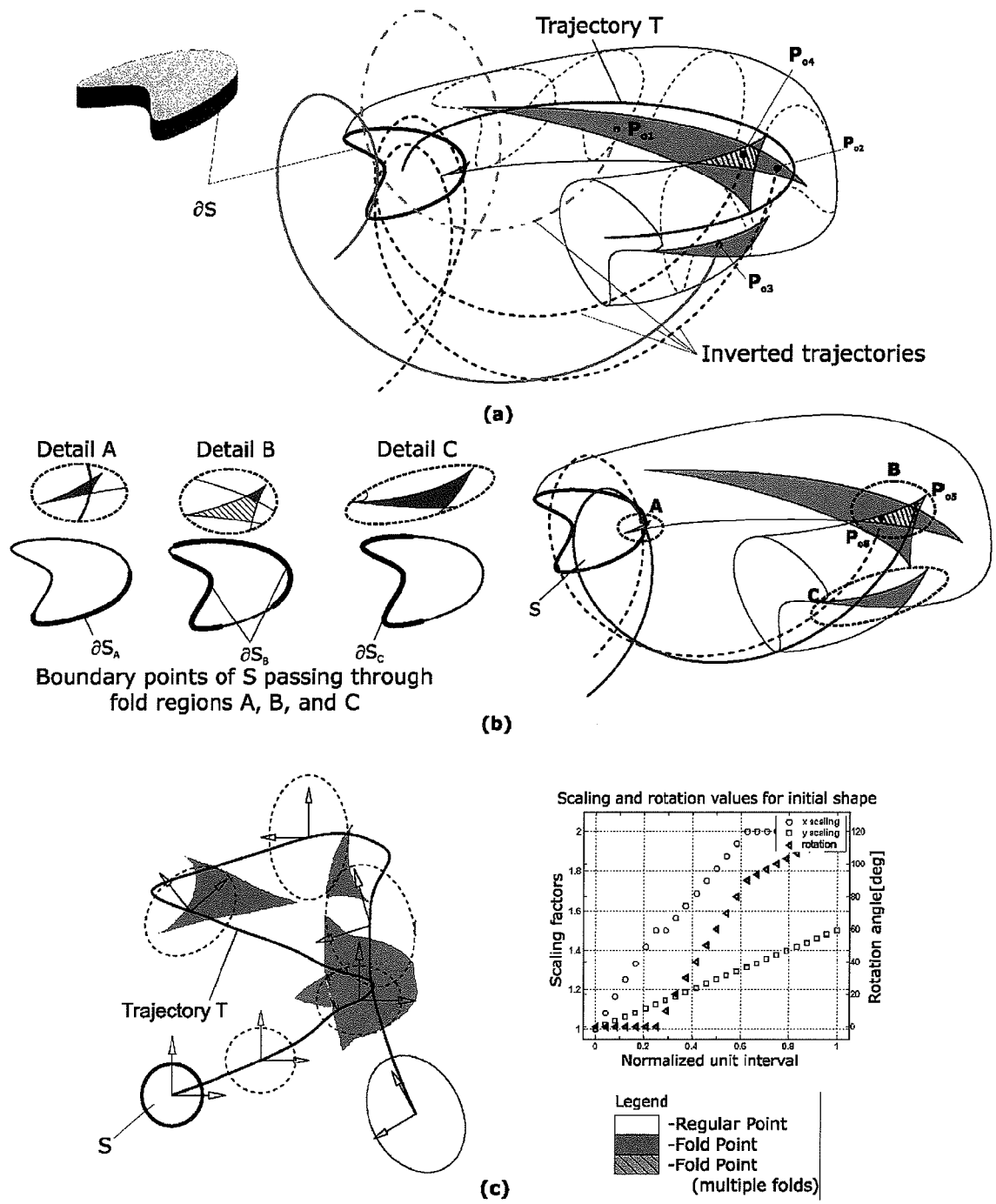
FIG. 8 is a schematic with three views illustrating three examples of prototype verification.

To see why, consider the circular disk that rotates around its "center" as shown in FIG. 6. The notch will generate fold points, yet loss of contact between the disk and its envelopes does not occur. In this case, the explanation is in fact surprisingly intuitive: the notch can never contact the envelopes for this motion so the fact that the notch generates a fold region has no implications on the contact. Another example is shown in FIG. 8(a) where the object maintains some contact points with its envelopes at every configuration, despite the three fold regions.

More generally, observe that contact is a local "event" and that the same object may have multiple contacts, i.e., contacts along disjoint subsets of the boundary of the object. For general motions, some of these contacting regions between a moving object and its envelope set may appear and disappear while the object maintains some contact points with its envelope set. However, in many engineering applications only a subset of these contacts will be functional, (i.e., will contribute to the function of the system) while the remaining contacts will be non-functional. Thus, the fact that these non-functional contacts vanish should have no consequence on the functionality of the system.

These arguments naturally lead to the question of what makes a specific contact point functional. While the answer to this question will be application dependent, in this disclosure, assume that a contact is functional if it is prescribed by the design engineer, so in this sense it captures the design intent. Thus, it is assumed that a system malfunction will occur if contact is lost between the prescribed contact boundary and the corresponding envelopes to the moving object. In other words, if a fold region is "generated" by the prescribed contact boundary, then functional loss of contact occurs. Otherwise, that particular fold region has no influence on the functional loss of contact. While the above statement seems intuitive, stating it formally is far from trivial and requires a careful definition of what is meant by a fold region being "generated" by a prescribed subset of boundary points.

The practical implications of these observations are important. A good design engineer that designs higher pairs can identify the expected contact boundary within the pair and can therefore specify it, or at least in principle. For example a designer would specify the circular arc in FIG. 6 as a contact boundary but not the notch. Thus, if loss of contact is detected for given shapes, motions and contact specifications, then one can change either the contact boundary, the motion, the geometry or a combination of these in order to eliminate the loss of contact.

By intersecting the inverted trajectories with the boundary of the moving set, the points $P_i^h \in \partial S$ that move through a given fold region of the space can be identified. Establishing a correlation between these points and specific loss of (or changes in) contacts can provide the subset of $\partial S$ that is responsible for specific changes in the contact between S and its envelopes. In turn, this can further enable systematic geometric changes to the moving shape S.

The inverted trajectory-solid intersections induce a disjoint decomposition of the space into:
   regular, fold and fold boundary points that are in the interior of the set swept by the moving object;
   sweep boundary points, and
   points that are out of the sweep.
Note that this decomposition can be used to interactively study the contact between the moving object and its envelopes.

Figure 7:
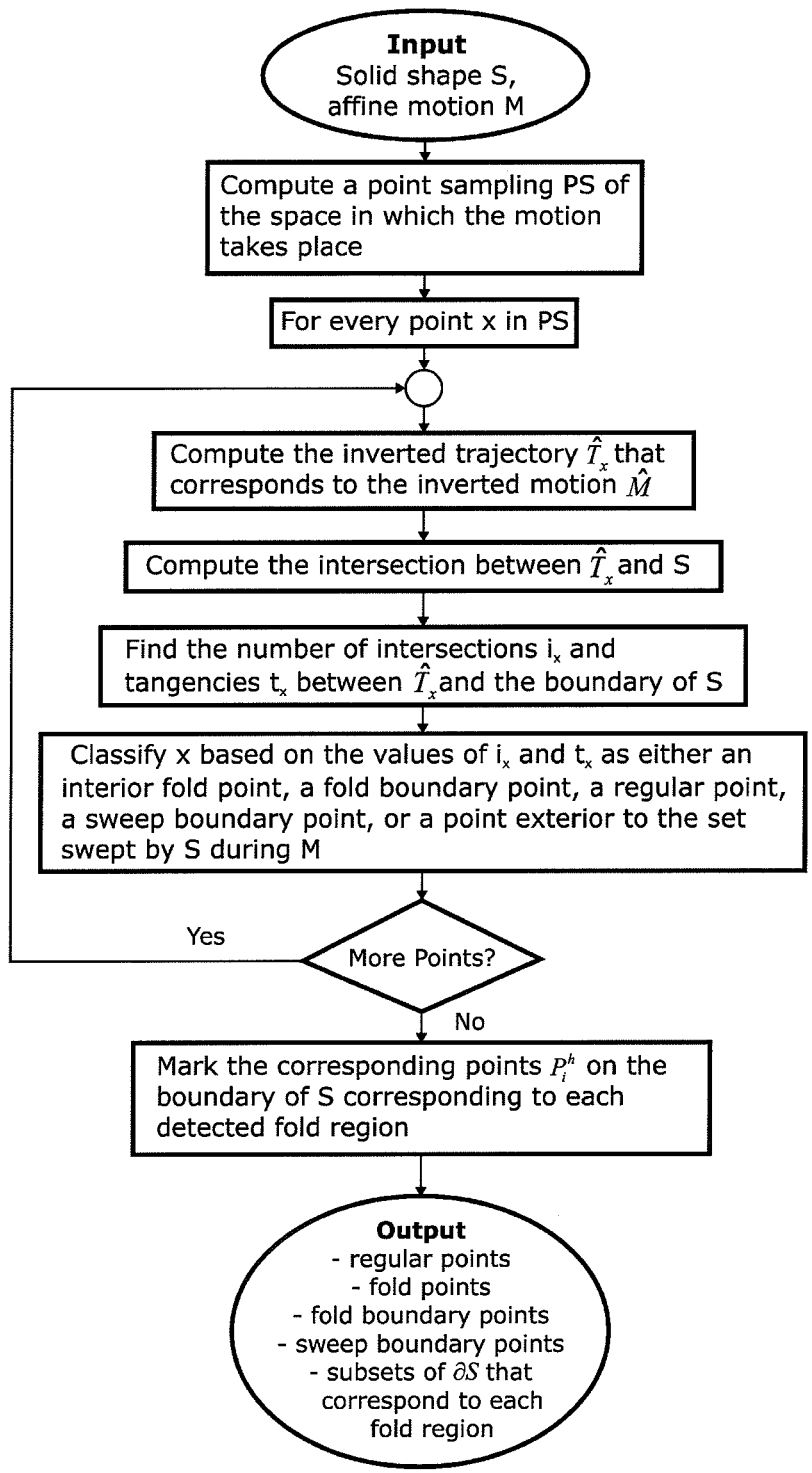
FIG. 7 is a flow diagram of one embodiment of the algorithm to detect and quantify envelope singularities in a plane.

Based on the above discussion, an algorithm is presented to detect and quantify the fold points of a planar solid shape moving according to a non-singular affine planar motion that relies on intersection tests between the inverted trajectories and the original representation of the shape. The algorithm also outputs the boundary points $P_i^h$ of S that will pass through each detected fold region during M. The main stages of one implementation of the algorithm are shown in FIG. 7.

That this approach provides a PMC test for the fold regions implies that these regions can be computed either exactly (within the machine precision) or approximately depending on what strategy is used to sample the points in the space of the motion.

Given a motion M, one can generate exact or approximate trajectories as well as inverted trajectories for any point in the space. The curve-surface intersection between $\hat{T}$ and $\partial_c S$ will depend on the representations used for both $\hat{T}$ and S. For example, if the solid is represented by its boundary representation, then the curve-surface intersection algorithm reduces to curve-face intersection between the inverted trajectory and the corresponding faces of the solid. This is a standard operation in CAD that is efficiently implemented in all commercial CAD systems. Furthermore, finding the number of intersections and tangencies between the inverted trajectory and the original shape representation (150 in FIG. 7) amounts to careful neighborhood analysis for the elements of the point sampling PS. This is a critical step as it must handle the degenerate cases as well as the corresponding numerical errors.

Once the neighborhood analysis is carried out and the tangencies are identified for each point $x \in T_x \cap \partial S$, the classification of each point x (160 in FIG. 7) follows the point membership test for general sweeps developed by the inventor. The set of all fold boundary points will form the boundary of the fold regions, which are not necessarily connected (see also section 3). Constructing the boundaries of these fold regions can follow any of the established boundary evaluation algorithms available for point sets or point clouds that will result, for example, in some tessellation (piecewise linear approximation) or an appropriate polynomial approximation. Furthermore, the inverted trajectories of those points that are in the boundary of the set swept by the moving S will have zero intersections and one or more tangencies with $S^o$. It is worth noting that the same sampling of the space used to detect the fold regions can be used to generate points that are on the boundary of sweep(S,M).

The computational cost associated with this invention depends on both the efficiency of the specific intersection test, as well as on how many times this test is actually performed. Therefore, an efficient implementation of this algorithm must not only take full advantage of the specific representation of the solid to make the intersection as efficient as possible, but must also reduce the number of times the intersection is carried out by performing adaptive sampling strategies of the space in which the motion takes place. Standard hierarchical sampling techniques, such as quadtrees/octrees, and other spatial partitioning techniques, as well as other adaptive sampling methods that may use a combination of seed points in space and spatial partitioning can significantly reduce the number of points for which intersection is carried out. At the same time, the approach disclosed herein is inherently parallel, since the tests are defined pointwise, which implies that parallel algorithms can potentially achieve impressive speed-ups.

Five examples are presented below that verify prototype implementation and illustrate some of the main capabilities of the approach described herein.

The first example in FIG. 8(a) shows the fold regions generated by a planar non-convex shape moving according to a planar rigid body motion, and illustrates the inverted trajectories for representative points from various fold region. In this example, the contact boundary is selected to be the full closed curve bounding the 2D solid. The second example builds on the first one by limiting the contact boundary, and discusses the changes induced by this limitation in the fold regions of FIG. 8(b). The same example illustrates the computed subset of points of the prescribed contact boundary ∂cS that are responsible for generating the two disjoint fold regions shown in that FIG. The third example shows a deformable shape moving according to an affine (non-rigid) motion and illustrates the computed fold regions. The fourth example shows an essentially rectangular shape moving according to a motion composed of a linear translation and a rotation by 180° around its center of gravity. This example identifies the subset of points of the boundary of the moving set that move through the identified fold regions. The last example shows the effect of eliminating the inner hole within the triangular domain as boundary of contact on the fold regions.

In all these examples a simple sampling of the plane along an orthogonal grid is employed, using code that implemented the steps outlined in FIG. 7 to identify the interior and boundary fold points generated by the prescribed boundary of contact. In the first and last two examples an approximation of the 3-dimensional surface Σ can be constructed in a commercial CAD package, which performed an orthogonal projection of this surface onto the plane of the motion, and compared this projection to computed results. Note that the quality of this approximation decreases significantly as the complexity of the motion and geometry increases. Furthermore, adaptive sampling strategies significantly reduces the number of sampled points, and therefore the number of curve/boundary intersections performed.

In the example shown in FIG. 8(a), the centroid of the non-convex 2D shape S moves according to an elliptical trajectory, while the shape rotates uniformly around its centroid by $2\pi/3$. The prescribed shape and motion generate the disjoint fold regions that are shown in the same figure. Observe that some of these fold regions are generated by the non-convex subset of the boundary of S, and that this non-convex subset cannot contact the envelopes for the prescribed motion. In FIG. 8(a), several fold points are chosen to illustrate the intersection of their inverted trajectories with shape $S^0$ (at t=0), and they all have an even number of intersections (either 4 or 6 in this example), but no tangencies, with ∂S. For the same example, three disjoint fold regions are selected, shown in detail A, B and C of FIG. 8(b), and the points of the boundary ∂S of S that will pass through each of the three fold regions are computed. Intuitively, if these points are not part of the actual boundary of contact between S and its envelopes, then these fold regions will have no influence on the functional contacts during M.

In the example shown in FIG. 8(c), the centroid of disk S translates along trajectory T, while the disk rotates non-uniformly by $2\pi/3$ around its centroid, and undergoes a non-uniform scaling. To illustrate the effect of the prescribed scaling, a number of configurations of set S are superimposed as it moves and deforms according to the affine motion. The set swept by the deformable disk S contains fold, fold boundary, as well as regular points (in the interior of sweep(S,M)) or points that are part of the boundary of sweep(S,M).

In the fourth example, the rectangle with rounded corners translates in the x direction along a linear trajectory T, while the rectangle rotates around its centroid by $\pi$. The intermediate positions were shown in order to illustrate the motion. This solid shape generates three separate fold regions during the prescribed motion marked as A, B and C. Each of these fold regions corresponds to different subsets of the boundary of S labeled as $\partial S_A$, $\partial S_B$, and $\partial S_C$ that contain points passing through each one of these fold regions. Again, each of these subsets seems to be responsible for specific changes in the local contact condition: for example $\partial S_C$, which is a connected curve, is clearly related to the loss of contact that happens between $\partial S_C$ and the envelope set (when S is near the vertical configuration in this figure). On the other hand, the influence of $\partial S_A$ and $\partial S_B$ on the contact is far less apparent for the parameter interval used to generate the motion. In this example, the two fold regions A and B "anticipate" the loss of contact outside of t∈[0,1]. Note that both $\partial S_A$ and $\partial S_B$ contain disconnected sets of boundary points, and that $\partial S_C$ is adjacent to the boundary of sweep(S,M), while both $\partial S_A$, and $\partial S_B$ are completely enclosed in the interior of the set swept by the moving object.

Figure 9:
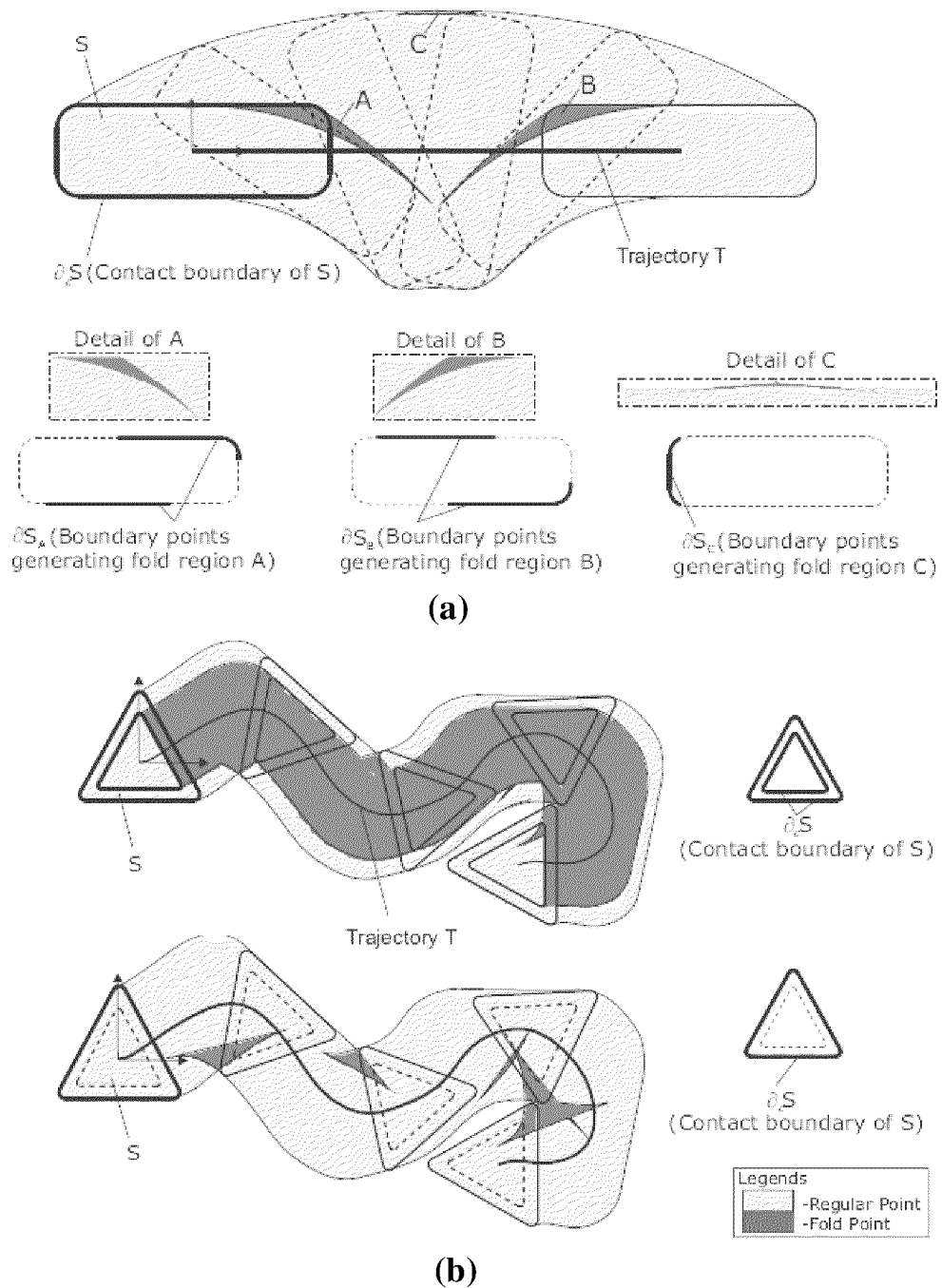
FIG. 9 is a schematic with two views illustrating two examples of prototype verification.

In the last example, the hollow triangle with round corners S moves according to a planar rigid body motion that contains a rotation around the triangle's centroid by $\pi/2$. By selecting all the faces of the triangle (including the hole) as a boundary of contact the fold regions illustrated in FIG. 9(b) can be obtained. Eliminating the boundary of the hole from the boundary of contact changes the fold regions as indicated in the same figure.

Instead of performing the inverted trajectory—solid intersections, one could sweep the 2D solid in the 3D space time domain as described above, for example within a commercial CAD package. This would provide an approximation of the 3-dimensional surface Σ, which can then be projected onto the plane of the motion to obtain the fold regions. Note that this projection would practically introduce a second level of approximation in the result. In general, constructing Σ in 3D and projecting it onto the plane in any CAD environment would involve fairly significant approximations particularly for complex planar shapes and motions. These approximations would translate into geometric errors of the computed fold regions, which are hard to quantify mathematically since they greatly depend on the local properties of the motion and geometry, but are easily detectable with the approach described above. Furthermore, these computations are simply not supported by current CAD technology when Σ exists in a 4-dimensional space. On the other hand, the above approach does not require envelope computations, and it therefore completely avoids all such approximations.

Figure 10:
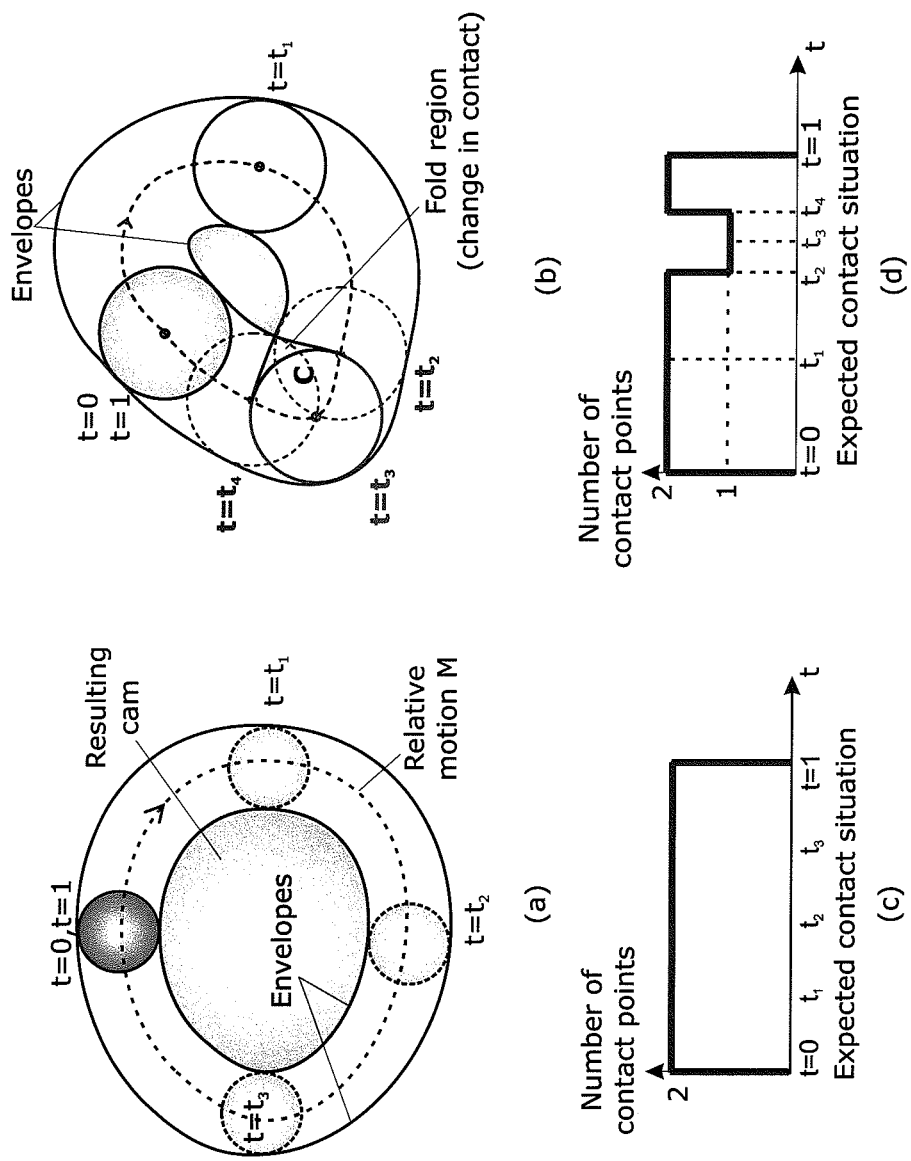
FIG. 10 is a schematic view and graph of simple cam-follower mechanisms with and without loss of contact.

Referring to FIG. 10, two versions of a cylindrical cam-follower mechanism are shown. FIG. 10 (a) illustrates the case where no change in the state of contact and FIG. 10 (b) illustrates contact changes and undercutting. When undercutting is not present, there are two points of contact between the circular follower and the boundary envelopes as seen in FIGS. 10(a) and (c). The occurrence of undercutting induces a change in the number of contact points, and the evolution of this change for the case shown in FIG. 10(b) is illustrated in FIG. 10(d).

Contact analysis involves parts that move relative to each other. In mechanical design the focus is often on cases when the moving generator object S is a d-dimensional solid moving in d-dimensional Euclidean space $E^d$, and d=2,3. Thus, for purposes of discussion below in this application, d=2 and motion M is a one parameter family of transformations M(t), where parameter t∈[0,1] belongs to a normalized unit interval. Observe that any interval [a, b] can be normalized to a unit interval [0,1] without placing any additional restrictions on the problem at hand. In an absolute coordinate system, each point y of an object S that moves according to M describes a trajectory $Ty=\{y^q | q \in M\}$. However, when observed from a moving coordinate system rigidly attached to the moving set S, the same point y will appear to describe a different trajectory denoted by $\hat{T}_y$. This inverted trajectory curve $\hat{T}_y$ can be computed not only for points of S, but also for any other point $x \in E^d$ of the space as $\hat{T}_x = \{x^q | q \in \hat{M}\}$, where $\hat{M}$ is the inverted motion defined as the inverse of M(t) for every value of t. It can be shown that the inverted trajectory $\hat{T}_x$ of a point x contains all points of space $E^d$ that pass through the given point x when moved according to motion M. Furthermore, both T and $\hat{T}$ can be (re)parameterized in a manner consistent with the parametrization of motion M(t).

The PMC test described above is defined in terms of inverted trajectory tests against the original geometric representation of the generator object S. More precisely, by intersecting the inverted trajectory of any point x of the space with the generator S in its initial configuration, one can classify point x as being "in", "on" or "out" relative to the set swept by S. In fact the PMC test induces a finer decomposition of the space because the "in" points are themselves classified into regular, fold and fold boundary points. This test can be implemented in any geometric representation that supports curve-solid intersections.

If motion M and inverted trajectories $\hat{T}_x$ are consistently parameterized, then this intersection test outputs not only the correct classification of point x relative to the swept set, but also the parameters t of motion M when boundary points of S pass through x during M. These boundary points (if they exist) are the only boundary points of S that would pass through the given x during M.

Figure 1:
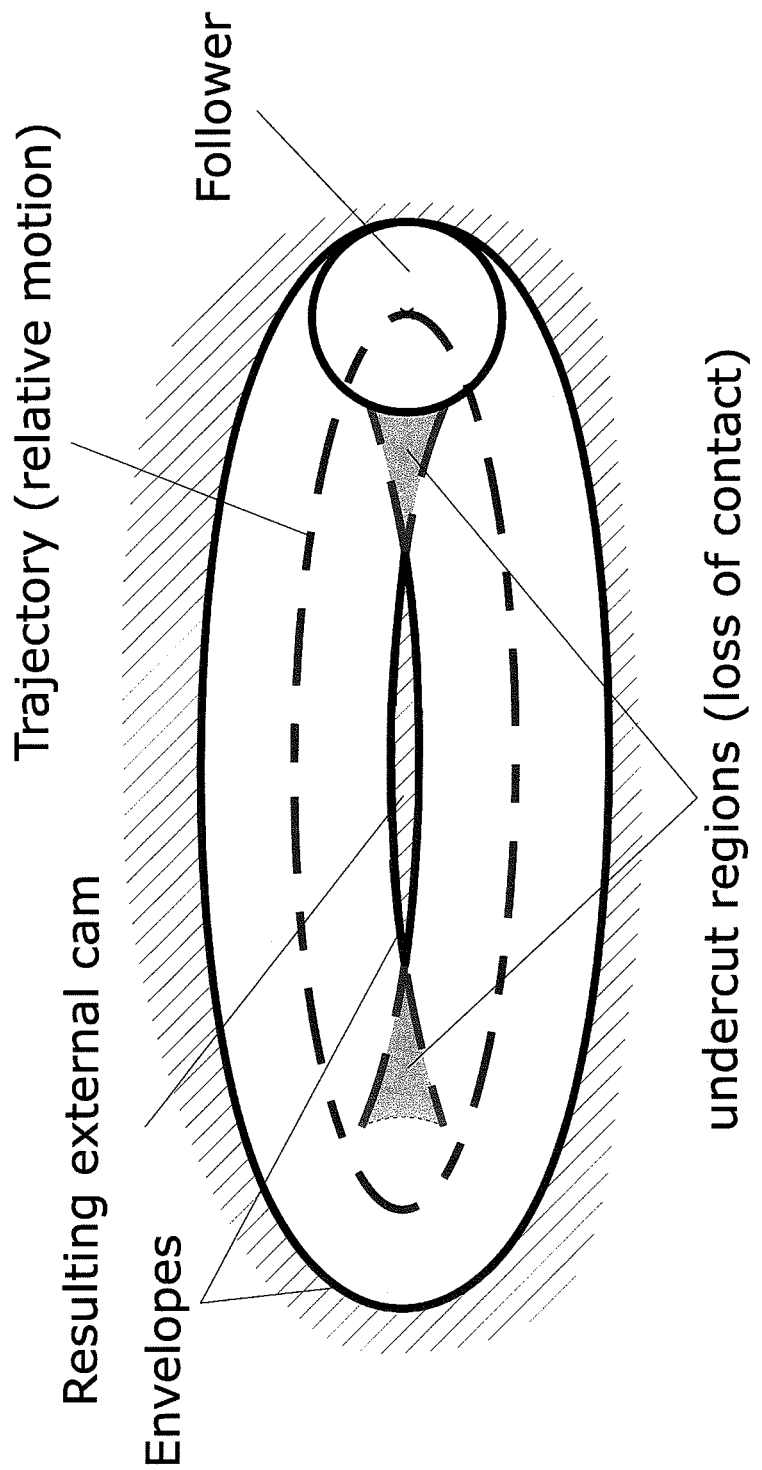
FIG. 1 is a schematic view of a geometric singularity and undercut regions

The ability to perform the PMC test enables a person to sample the space in which the object moves and perform the sweep boundary evaluation. One approach is where an octree decomposition of the space is used as a sampling strategy, but other approaches such as marching cubes or Monte Carlo based sampling could be also employed. Through post-processing of these sweep boundary points and corresponding parameter values, the number of (sampled) contact points between S and its boundary envelopes that fall within specific parameter intervals can be computed. Note that these computations require only post-processing of existing data comprised of points on the boundary of the sweep and their associated parameter values. Thus, as the motion parameter increases monotonically, a sudden change in the number of contact points would indicate a change in the state of contact between the moving object S and its envelopes that are on the boundary of the set sweep(S,M). For the example shown in FIG. 1(b), the follower initially has two contact points with the boundary of its swept set, but this state of contact changes as the prescribed motion progresses.

An algorithm to count the number of contact points can be developed by discretizing the parameter interval into smaller subintervals of, for example, equal lengths followed by counting the number of points that fall within every particular interval. In other words, one can employ a parametric discretization to count the number of contact points. By examining the number of points that fall within two such successive intervals, one can detect large changes in the number of contact points between adjacent intervals.

A vector x contains the list of boundary points of sweep(S, M) output by the boundary evaluator. For each such point $x_i$, the boundary evaluator returns a list of parameter values where boundary points of S will pass through $x_i$. What is considered in the algorithm to be a "significantly different" change in the number of contact points will strongly depend on the dimension of the space and on the sampling algorithm being used.

Figure 11:
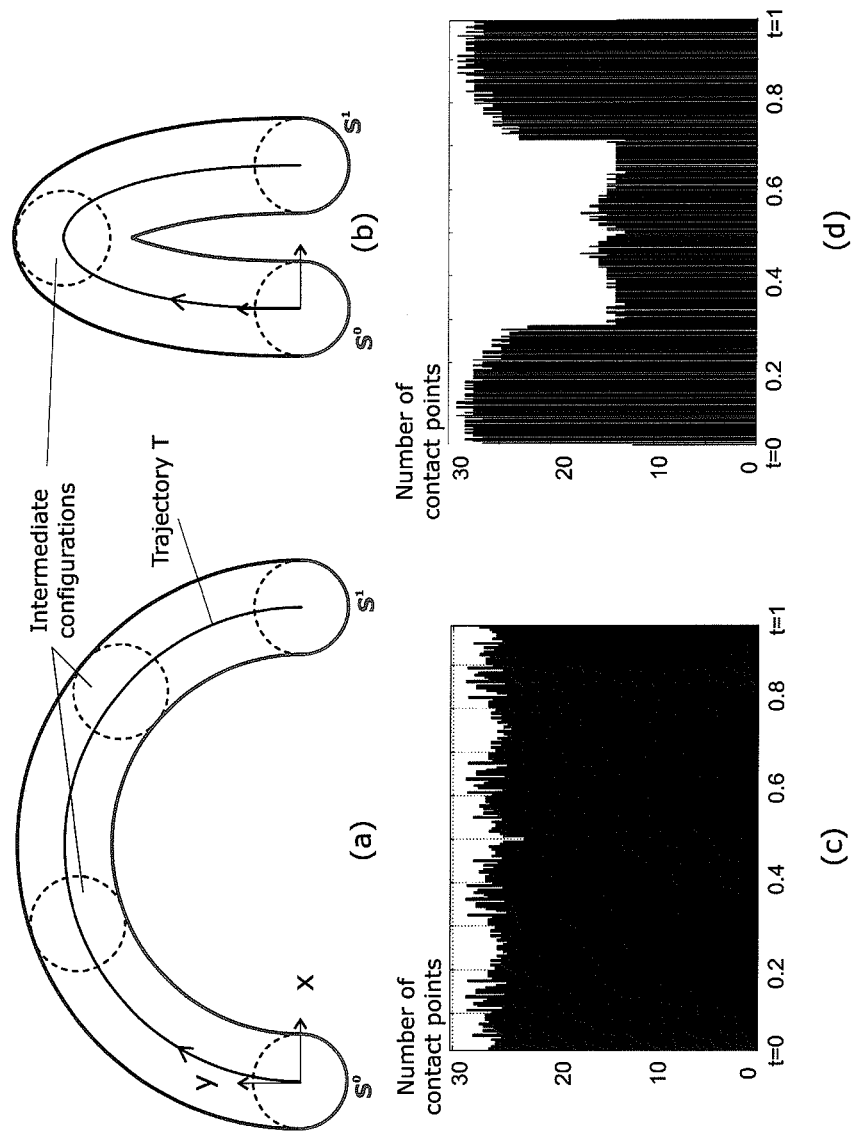
FIG. 11 is a schematic view and graph of a planar disk moving according to a circular and a elliptical motion and associated number of contacts computed base on parametric discretization.

To illustrate the output of this algorithm, consider a 2-dimensional disk moving according to a planar rigid body motion such that the center of the disk moves along a semi-circle or an elliptical trajectory as shown in FIG. 11. The algorithm outputs the data shown in FIG. 11(c) for the circular motion during which the disk has exactly two contact points with its envelopes throughout the motion. During the ellipti-cal motion, the state of contact between the disk and its boundary envelopes is changing, and the output of the algorithm for that motion is shown in FIG. 11(d). It can be seen that even though the parameter intervals do not contain a constant number of points, due in this case to the non-uniformity of the sampling, there are no sudden (and large) jumps in the number of points between successive intervals in FIG. 2(c). On the other hand, large jumps in the number of points are apparent in FIG. 2(d) that corresponds to the elliptical trajectory. The noise due to the non-uniformity of the sampling in FIGS. 2 (c) and (d) is related to the fact that the octree cells are aligned with the coordinate axes in this example. Therefore the distance between the centers of two adjacent partial cells varies during the motion: it is minimum when the angle between the tangent and the x axis is a multiple of $\pi/2$, and maximum when the angle is a multiple of 45 degrees. Note that similar effects can be observed for any alignment of the octree cells.

In some cases, a correct interpretation of these results may be difficult because the changes in the computed number of contact points may not be sufficiently large. In a few words, this issue occurs because of the sampling in the Euclidean space, while the counting of points occurs in the parameter space, and the two spaces do not share the same distance metric.

Figure 12:
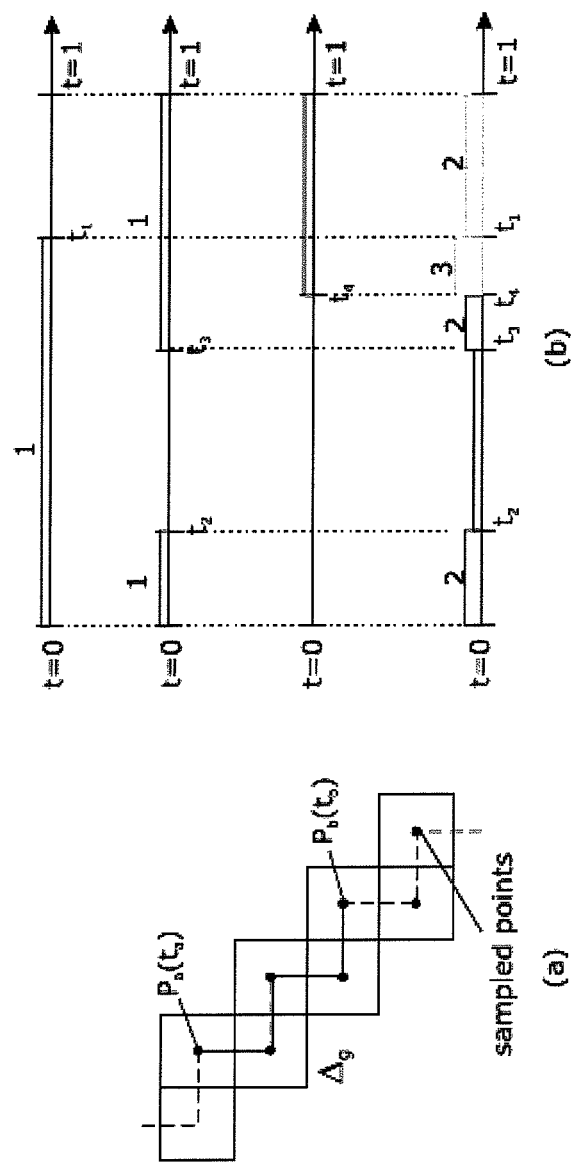
FIG. 12 is a schematic view illustrating a "Manhattan" distance metric.

An alternative to the parametric discretization described above is to perform first a uniform discretization of the point cloud containing points of the envelopes into elementary boundary units, and then translate these geometric units of equal size into (non-uniform) parametric intervals in the parameter space. Since the exemplary sampling uses octrees, and since all of the exemplary partial octree cells that capture boundary points have the same size, a "Manhattan" distance metric can be used to measure these elementary boundary units. This is illustrated in FIG. 12(a). A parameter interval $[t_a, t_b]$ corresponds to each such boundary unit of length $\Delta_g$, and these parameter intervals will, in general, not be of the same length despite the fact that all boundary units have equal size.

Each such boundary unit will have one contact point associated with it, which remains a valid assumption as long as the length of the boundary unit is smaller than the distance between any two boundary points of S that are in contact with the boundary of the set swept by S at any parameter t of M.

Traversing the computed sweep boundary points—one boundary unit at a time, collecting all parametric intervals $[t_a, t_b]$, and aligning them on the real line results in a finer discretization of the parametric interval [0,1] because some of these intervals overlap. By adding the corresponding contact points within each such parametric interval, the number of contact points for each interval can be obtained as shown in FIG. 12(b). The smaller the size of the boundary unit, the higher the accuracy of predicting contact changes, which is limited by the resolution of the original sampling. It is important to note that computing the number of contact points based on the Manhattan distance metric results in the correct number of contact points and correct values of the motion parameter where contact changes occur up to the resolution prescribed by $\Delta_g$. The accuracy of the computed state of contact is limited by the quality of the space sampling. This implies that this approach may not detect a change in the state of contact that occurs within a parameter range that is comparable to the parametric resolution dictated by the sampling. For the example illustrated in FIG. 12(b), if $t_1$-$t_4$ is of the same order of magnitude as min($t_b$-$t_a$) for all partial cells, the changes in contact at $t_4$ and $t_1$ could be missed.

Figure 13:
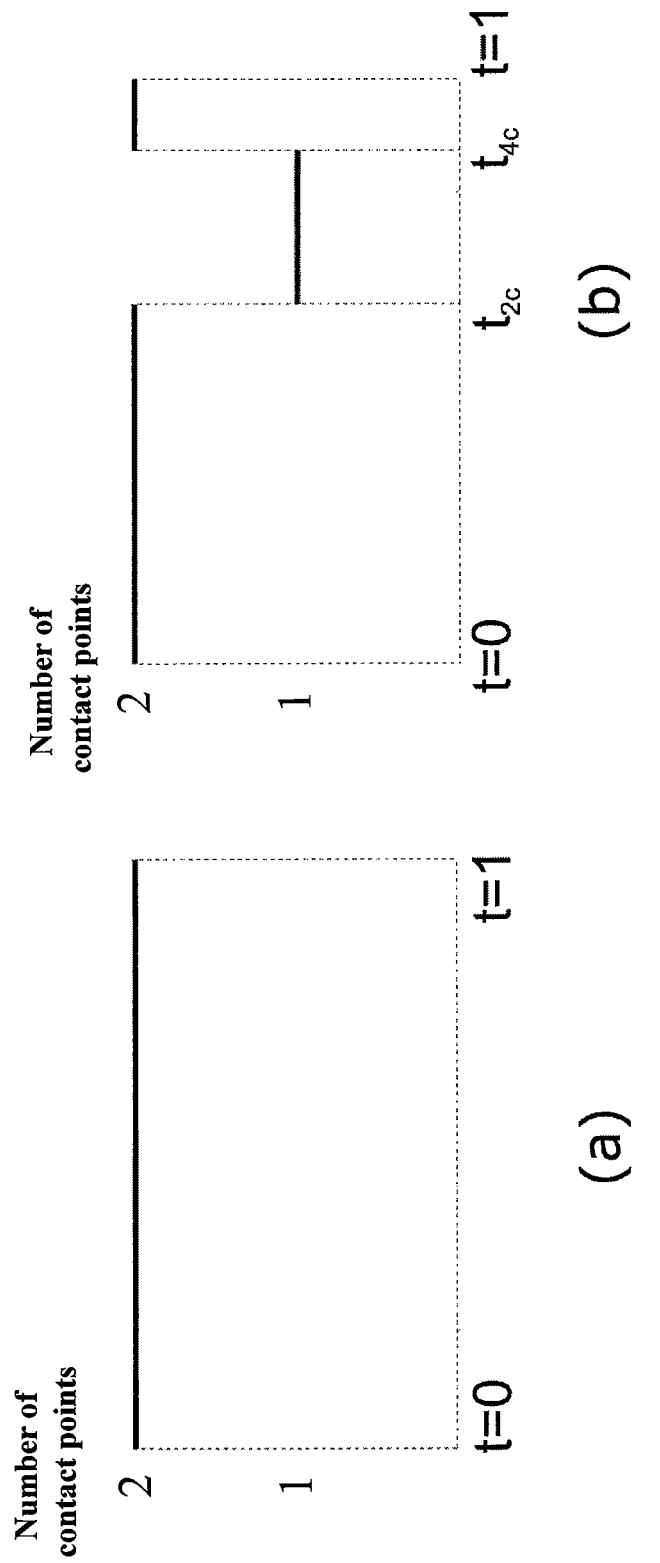
FIG. 13 is two graphs illustrating the number of contact points of FIG. 10 computed based on the Manhattan distance metric.

An exemplary embodiment of this method can re-examine the cam-follower case shown in FIG. 10. The computed number of contact points between this moving circular follower and its boundary has been computed based on the Manhattan distance metric as described above and illustrated in FIG. 13. This number of contact points is two everywhere in FIG. 13(a), but is either two or one for the case shown in FIG. 13(b). The change in the state of contact occurs at $t=t_{2c}$ and $t=t_{4c}$ where the number of contact points goes down to one and then back to two as t goes from 0 to 1. Here $t_{2c}$ and $t_{4c}$ are the computed values of the parameter t where contact changes are expected to occur. Note that the computed state of contact is the same as the estimated one shown in FIGS. 10(c) and (d).

Some or all of the functional operations described in this specification can be implemented in digital electronic circuitry, or in computer software, firmware, or hardware, including the structures disclosed in this specification and their structural equivalents, or in combinations of them. Embodiments of the invention can be implemented as one or more computer program products, i.e., one or more modules of computer program instructions encoded on a computer readable medium, e.g., a machine readable storage device, a machine readable storage medium, a memory device, or a machine-readable propagated signal, for execution by, or to control the operation of, data processing apparatus.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of them. A propagated signal is an artificially generated signal, e.g., a machine-generated electrical, optical, or electromagnetic signal, that is generated to encode information for transmission to suitable receiver apparatus.

A computer program (also referred to as a program, software, an application, a software application, a script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for executing instructions and one or more memory devices for storing instructions and data. Generally, a computer will also include, or be operatively coupled to, a communication interface to receive data from or transfer data to, or both, one or more mass storage devices for storing data, e.g., magnetic, magneto optical disks, or optical disks.

Moreover, a computer can be embedded in another device, e.g., a mobile telephone, a personal digital assistant (PDA), a mobile audio player, a Global Positioning System (GPS) receiver, to name just a few. Information carriers suitable for embodying computer program instructions and data include all forms of non volatile memory, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the invention can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the invention can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the invention, or any combination of such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

Certain features which, for clarity, are described in this specification in the context of separate embodiments, may also be provided in combination in a single embodiment. Conversely, various features which, for brevity, are described in the context of a single embodiment, may also be provided in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Particular embodiments of the invention have been described. Other embodiments are within the scope of the following claims. For example, the steps recited in the claims can be performed in a different order and still achieve desirable results. In addition, embodiments of the invention are not limited to database architectures that are relational; for example, the invention can be implemented to provide indexing and archiving methods and systems for databases built on models other than the relational model, e.g., navigational databases or object oriented databases, and for databases having records with complex attribute structures, e.g., object oriented programming objects or markup language documents. The processes described may be implemented by applications specifically performing archiving and retrieval functions or embedded within other applications.

What is claimed:

1. A method for detecting and quantifying envelope singularities, wherein said method is performed by a system having a processor and a memory that contains instructions that are readable by said processor to control said processor to perform actions of:
    constructing a solid three-dimensional shape having a motion starting from an original position;
    selecting a sample set of points in a space in which the motion of the solid shape occurs;
    determining, for each point in the selected sample set of points, values of:
        an inverted motion of the motion;
        one or more inverted trajectories that correspond to points of the space associated with the inverted motion;
        one or more intersections between the inverted trajectories and a boundary defined by the solid shape in the original position; and
        one or more tangencies between the inverted trajectories and the boundary defined by the solid shape in the original position;
    classifying each point in the set of points as a function of values of the intersections and tangencies, each classification being one of a set of classifications selected from the group consisting of an interior fold point, a fold boundary point, a regular point, a sweep boundary point, or a point exterior to the set swept by the solid shape during the motion;
    labeling corresponding points of the space defined by the motion of the solid shape corresponding to each classified interior fold point and fold boundary point to obtain a plurality of interior fold points and a plurality of fold boundary points; and
    constructing a two-dimensional or three-dimensional region defined by points selected from the group consisting of: the plurality of interior fold points, the plurality of fold boundary points and combinations of the foregoing, said region defining the quantity of envelope singularities to detect and quantify said envelope singularities.

2. A method in accordance with claim 1, wherein constructing the solid shape includes defining a plurality of ranges of geometries and motions for the solid shape.

3. A method in accordance with claim 1, wherein the solid shape is defined by a plurality of sets of points, each set of points including curves and surfaces.

4. A method in accordance with claim 3, wherein the plurality of sets of points defines a moving front and other deforming boundaries.

5. A method for computing offset curves for a planar curve and offset surfaces for 3-D curve or a 3-D surface, wherein said method is performed by a system having a processor and a memory that contains instructions that are readable by said processor to control said processor to perform actions of:
    constructing a solid two dimensional disc or a solid three-dimensional sphere having a motion starting from an original position;
    causing the solid two-dimensional disc to have a disc motion to traverse the curve or the solid three-dimensional sphere to have a sphere motion to traverse the 3-D curve or the 3-D surface;
    selecting a sample set of points in a space in which the disc motion or sphere motion occurs;
    determining, for each point in the selected sample set of points in a space in which the disc motion or the sphere motion occurs, values of:
        an inverted motion of the motion;
        one or more inverted trajectories that correspond to points of the space associated with the inverted motion;
        one or more intersections between the inverted trajectories and a boundary defined by the solid two-dimensional disc or the solid three-dimensional sphere in the original position; and
        one or more tangencies between the inverted trajectories and the boundary defined by the solid two-dimensional disc or the solid three-dimensional sphere in the original position;
    classifying each point in the set of points as a function of values of the intersections and tangencies, each classification being one of a set of classifications selected from the group consisting of an interior fold point, a fold boundary point, a regular point, a sweep boundary point, and a point exterior to the set swept by the solid two-dimensional disc or solid three-dimensional sphere during the motion;
    labeling corresponding points of the space defined by the disc motion or sphere motion corresponding to each classified sweep boundary point and fold boundary point to obtain a plurality of sweep boundary points and a plurality of fold boundary points; and
    constructing a one-dimensional curve or two-dimensional surface defined by points selected from the group consisting of: the plurality of sweep boundary points, the plurality of fold boundary points, and any combinations thereof, said region defining the offset curves defined by the solid two-dimensional disc or the offset surfaces defined by the solid three-dimensional sphere surfaces.

6. A non-transitory machine readable storage medium comprising instructions that are readable by a processor and cause said processor to:
    define a solid three dimensional shape having a motion starting from an original position;
    select a sample set of points in a space in which the motion of the solid shape occurs;
    determine, for each point in the selected sample set of points, values of:
        an inverted motion of the motion;
        an inverted trajectory that corresponds to the inverted motion;
        intersections between the inverted trajectory and a boundary defined by the solid shape in the original position; and
        tangencies between the inverted trajectory and the boundary defined by the solid shape in the original position;
    classify each point in the set of points as a function of values of the intersections and tangencies, each classification being one of a set of classifications selected form the group consisting of an interior fold point, a fold boundary point, a regular point, a sweep boundary point, or a point exterior to the set swept by the solid shape during the motion;
label corresponding points of the space defined by the motion of the solid shape corresponding to each classified interior fold point and fold boundary point to obtain a plurality of interior fold points and a plurality of fold boundary points; and
construct a two-dimensional or three-dimensional region defined by the plurality of fold boundary points, the plurality of fold boundary points and combinations of the foregoing, said region defining the quantity of envelope singularities, so that at least one envelope singularity is detected and quantified.

7. A method for detecting and quantifying envelope singularities, wherein said method is performed by a system having a processor and a memory that contains instructions that are readable by said processor to control said processor to perform actions of:
constructing a first solid three dimensional shape having a motion starting from an original position;
constructing a second solid three dimensional shape, possibly having a second motion starting from an original position;
determining relative motion of the first solid shape relative to the second solid shape;
selecting a sample set of points in a space in which the second shape exists;
determining, for each point in the set of points, values of:
an inverted motion of the relative motion between the first and second shapes;
inverted trajectories that correspond to points of the space associated with the inverted motion;
intersections between the inverted trajectories and a boundary defined by the first solid shape in the original position; and
tangencies between the inverted trajectories and the boundary defined by the first solid shape in the original position;
classifying each point in the set of points as a function of values of the intersections and tangencies, each classification being one of a set of classifications selected from the group consisting of an interior fold point, a fold boundary point, a regular point, a sweep boundary point, or a point exterior to the set swept by the solid shape during the motion;
labeling corresponding points of the space defined by the motion of the solid shape corresponding to each classified interior fold point and fold boundary point to obtain a plurality of interior fold points and a plurality of fold boundary points; and
constructing a two-dimensional or three-dimensional region defined by the plurality of fold boundary points, the plurality of fold boundary points and combinations of the foregoing, said region defining the quantity of envelope singularities.

8. A method in accordance with claim 7, further comprising:
determining a contact between the first solid shape and the second shape based at least in part on the classifications of each point in the set of points.

9. A method in accordance with claim 8, further comprising:
detecting a loss of contact between the first solid shape and the second shape based at least in part on the classifications of each point in the set of points.

10. A method in accordance with claim 9, further comprising:
quantifying the loss of contact between the first solid shape and the second shape.

11. A method in accordance with claim 8, further comprising:
determining a contact path between the first solid shape and the second shape based in part on the contact; and
quantifying the contact path for at least one of a group of selected processes on the first solid shape against the second shape.

12. A method in accordance with claim 7, wherein defining the first solid shape and defining the second shape include defining a plurality of ranges of geometries and motions for the first solid shape and second shape.

13. A system for detecting and quantifying envelope singularities, comprising:
a processor; and a memory that contains instructions that are readable by said processor to control said processor to:
construct a solid three dimensional shape having a motion starting from an original position;
select a sample set of points in a space in which the motion of the solid shape occurs;
determine, for each point in the selected sample set of points, values of:
an inverted motion of the motion;
one or more inverted trajectories that correspond to points of the space associated with the inverted motion;
one or more intersections between the inverted trajectories and a boundary defined by the solid shape in the original position; and
one or more tangencies between the inverted trajectories and the boundary defined by the solid shape in the original position;
classify each point in the set of points as a function of values of the intersections and tangencies, each classification being one of a set of classifications selected from the group consisting of an interior fold point, a fold boundary point, a regular point, a sweep boundary point, or a point exterior to the set swept by the solid shape during the motion; and
label corresponding points of the space defined by the motion of the solid shape corresponding to each classified interior fold point and fold boundary point to obtain a plurality of interior fold points and a plurality of fold boundary points; and
construct a two-dimensional or three-dimensional region defined by the plurality of fold boundary points, the plurality of fold boundary points and combinations of the foregoing, said region defining the quantity of envelope singularities.

* * * * *

UNITED STATES PATENT AND TRADEMARK OFFICE
CERTIFICATE OF CORRECTION

| | | |
|---|---|---|
| PATENT NO. | : 8,849,617 B2 | Page 1 of 1 |
| APPLICATION NO. | : 12/181252 | |
| DATED | : September 30, 2014 | |
| INVENTOR(S) | : Horea T. Ilies | |

It is certified that error appears in the above-identified patent and that said Letters Patent is hereby corrected as shown below:

Title page, item 75 Horea T. Iliaes should read as follows: Horea T. Ilies.

Signed and Sealed this

Twenty-fourth Day of November, 2015

Michelle K. Lee
*Director of the United States Patent and Trademark Office*